(12) United States Patent
Sakai et al.

(10) Patent No.: US 11,199,563 B2
(45) Date of Patent: Dec. 14, 2021

(54) ELECTRIC CURRENT SENSOR

(71) Applicant: DENSO CORPORATION, Kariya (JP)

(72) Inventors: Ryosuke Sakai, Kariya (JP); Tatsuaki Sugito, Kariya (JP); Takuma Esaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 12 days.

(21) Appl. No.: 16/747,599

(22) Filed: Jan. 21, 2020

(65) Prior Publication Data
US 2020/0150155 A1    May 14, 2020

Related U.S. Application Data

(63) Continuation of application No. PCT/JP2018/035672, filed on Sep. 26, 2018.

(30) Foreign Application Priority Data

Oct. 6, 2017   (JP) .............................. JP2017-196294

(51) Int. Cl.
*G01R 19/00* (2006.01)
*G01R 15/20* (2006.01)
*G01R 33/09* (2006.01)

(52) U.S. Cl.
CPC ....... *G01R 19/0092* (2013.01); *G01R 15/205* (2013.01); *G01R 33/093* (2013.01)

(58) Field of Classification Search
CPC G01R 19/0092; G01R 33/093; G01R 33/091; G01R 33/072
See application file for complete search history.

(56) References Cited

U.S. PATENT DOCUMENTS

| 5,590,855 | A | * | 1/1997 | Kato ..................... A63H 19/34 246/202 |
| 6,515,468 | B1 | | 2/2003 | Morimoto et al. |
| 2013/0015843 | A1 | * | 1/2013 | Doogue .............. G01R 15/148 324/202 |
| 2014/0111196 | A1 | | 4/2014 | Sakai et al. |
| 2017/0074908 | A1 | * | 3/2017 | Nejatali .................. H02J 7/025 |
| 2018/0017656 | A1 | * | 1/2018 | Kato ..................... G01R 15/20 |

FOREIGN PATENT DOCUMENTS

| JP | H6-013496 Y2 | 9/1988 |
| JP | S64-8668 U | 1/1989 |
| JP | H09-257835 A | 10/1997 |
| JP | 2007-093468 A | 4/2007 |
| JP | 2009-150653 A | 7/2009 |

(Continued)

*Primary Examiner* — Dominic E Hawkins
(74) *Attorney, Agent, or Firm* — Posz Law Group, PLC

(57) ABSTRACT

The current sensor for the current path includes: the current path; a magnetic detection unit having a magnetic detection element opposed to the current path and converting an alternating-current magnetic field generated from the current path into an electric signal, a signal line and a reference potential line; and a wiring board, on which the magnetic detection unit is mounted, having an insulation base and a wiring with a signal wiring connected to the signal line and a reference potential wiring connected to the reference potential line. A part of the signal wiring and a part of the reference potential wiring are arranged inside the insulation base.

9 Claims, 7 Drawing Sheets

(56) References Cited

FOREIGN PATENT DOCUMENTS

| | | |
|---|---|---|
| JP | 2012-078124 A | 4/2012 |
| JP | 2014-082682 A | 5/2014 |
| JP | 2015-125042 A | 7/2015 |
| JP | 2015-132567 A | 7/2015 |
| JP | 2015-148470 A | 8/2015 |
| JP | 2015-179043 A | 10/2015 |
| JP | 2016-178799 A | 10/2016 |
| JP | 2017-072467 A | 4/2017 |

* cited by examiner

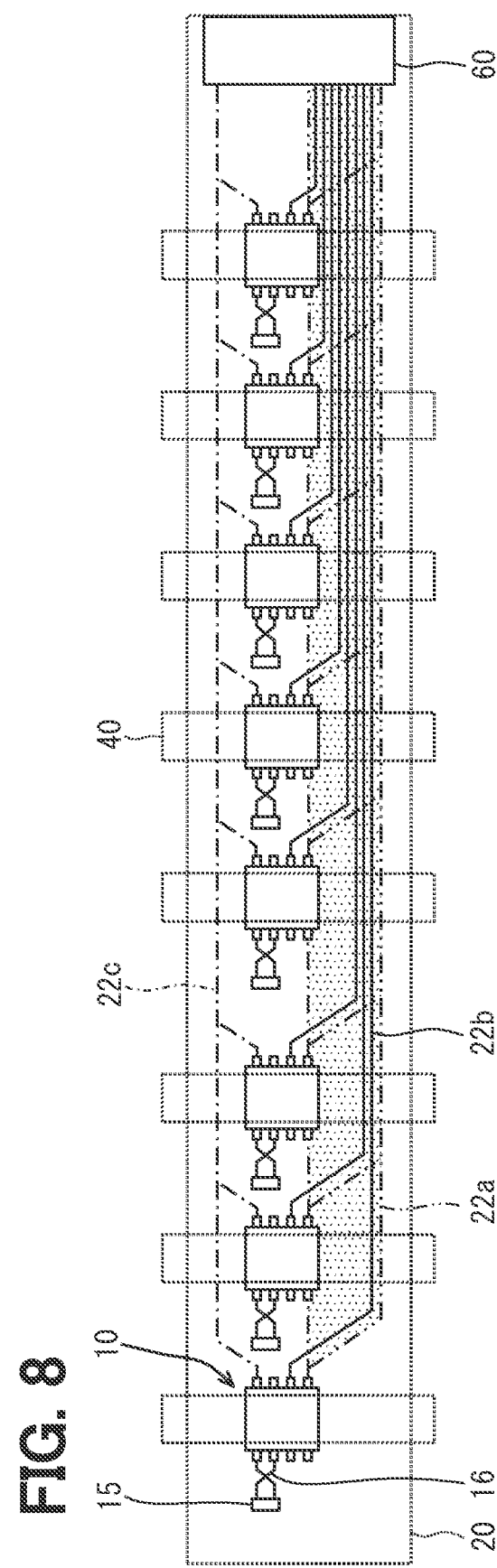

… (1) …

ELECTRIC CURRENT SENSOR

CROSS REFERENCE TO RELATED APPLICATION

The present application is a continuation application of International Patent Application No. PCT/JP2018/035672 filed on Sep. 26, 2018, which designated the U.S. and claims the benefit of priority from Japanese Patent Application No. 2017-196294 filed on Oct. 6, 2017. The entire disclosures of all of the above applications are incorporated herein by reference.

TECHNICAL FIELD

The present disclosure relates to an electric current sensor.

BACKGROUND

Conventionally, as an example of a current sensor, there is an electric current sensor.

In the current sensor, a sensor chip having a magneto-electric conversion element and a circuit chip having a processing circuit are mounted on one surface of a mounting substrate. In the current sensor, the first pad of the sensor chip and the third pad of the circuit chip are electrically connected by the first wiring, and the second pad of the sensor chip and the fourth pad of the circuit chip are electrically connected with the second wiring. The current sensor is provided such that the first wiring and the second wiring intersect with each other when viewing the one side of the mounting substrate from above the one surface.

As a result, in the current sensor, a first region on the magnetoelectric conversion element side and a second region on the processing circuit side are formed. For this reason, in the current sensor, the induced electromotive force generated in each region when the magnetic flux penetrates the first region and the second region cancels each other, so that the electric signal output from the magnetoelectric conversion element is less affected by the induced electromotive force.

SUMMARY

According to an example, a current sensor for a current path includes: the current path; a magnetic detection unit having a magnetic detection element opposed to the current path and converting an alternating-current magnetic field generated from the current path into an electric signal, a signal line and a reference potential line; and a wiring board, on which the magnetic detection unit is mounted, having an insulation base and a wiring with a signal wiring connected to the signal line and a reference potential wiring connected to the reference potential line. A part of the signal wiring and a part of the reference potential wiring are arranged inside the insulation base.

BRIEF DESCRIPTION OF THE DRAWINGS

The above and other objects, features and advantages of the present disclosure will become more apparent from the following detailed description made with reference to the accompanying drawings. In the drawings:

FIG. 8 is a plan view showing a schematic configuration of the current sensor according to the second embodiment.

DETAILED DESCRIPTION

Figure 1:
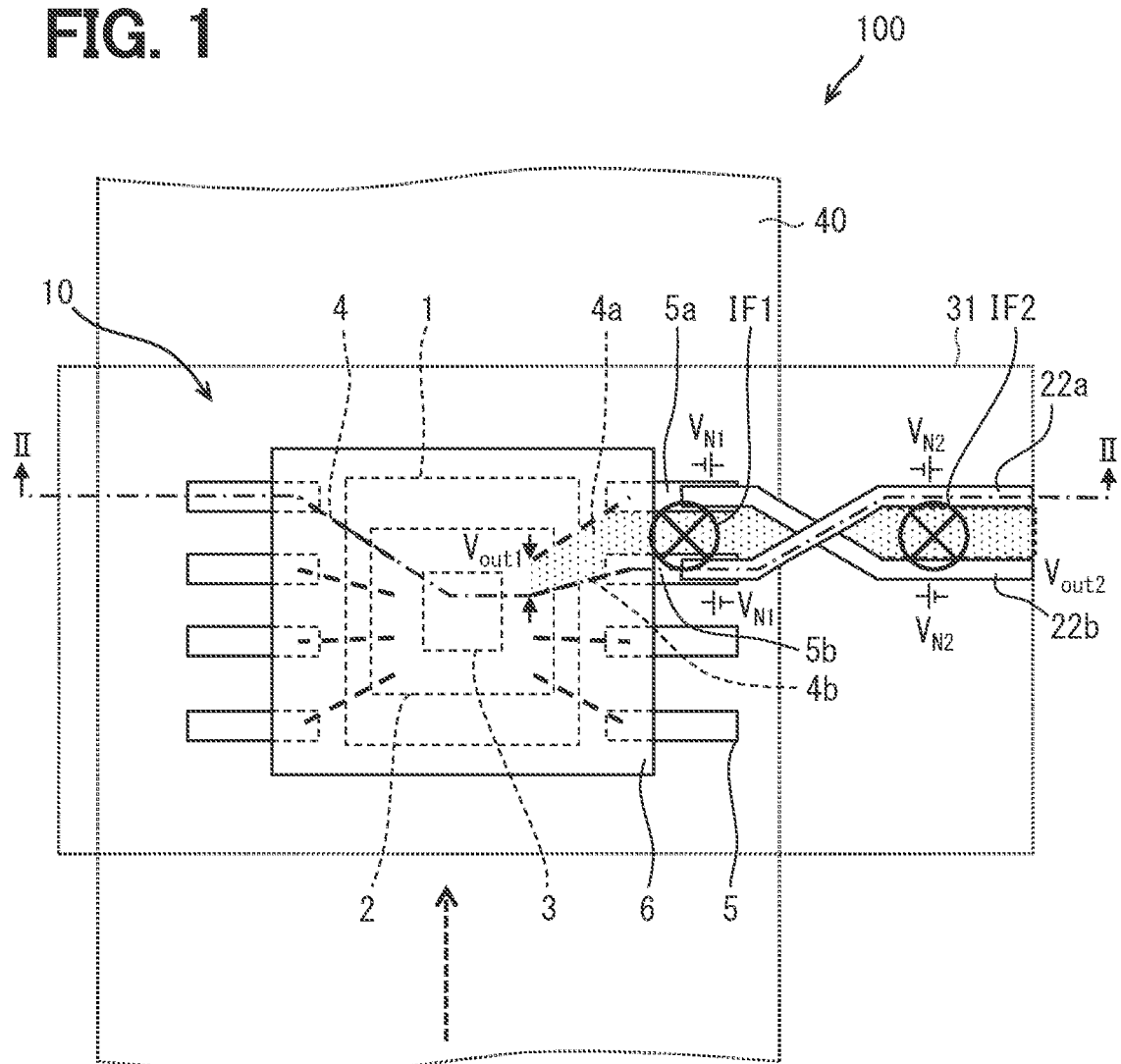
FIG. 1 is a plan view showing a schematic configuration of a current sensor according to a first embodiment.

It may not be sufficient for a comparative current sensor to simply cancel the induced electromotive force on the wiring, and the detection accuracy may be reduced.

Thus, an electric current sensor is provided with suppressing a reduction of a detection accuracy.

According to a first aspect of the present embodiments, an electric current sensor for detecting a current flowing in a current path, includes: a current path; a magnetic detection unit having a magnetic detection element opposite to the current path and converting an alternating-current magnetic field, generated from the current path when an alternating current flows in the current path, to an electric signal, a signal line through which the electric signal flows, and a reference potential line that provides a reference potential; and a wiring substrate, on which the magnetic detection unit is mounted, including an insulation base, a signal wiring electrically connected to the signal line and disposed on the insulation base and a reference potential wiring electrically connected to the reference potential line and disposed on the insulation base. A part of the signal wiring and a part of the reference potential wiring are arranged inside the insulation base. The signal wiring and the reference potential wiring are arranged so as to intersect with each other, and a region, to which the interlinkage magnetic flux generated by the alternating-current magnetic field is applied, is divided into two or more areas.

In the current sensor, the region, to which the interlinkage magnetic flux generated by the alternating-current magnetic field is applied, is divided into two or more areas. Accordingly, in the present disclosure, when viewed from the reference potential, the signal wiring is divided into two areas where the positive induced voltage and the negative induced voltage are generated, and the reference potential wiring is divided into two areas where the positive induced voltage and the negative induced voltage are generated. Therefore, the above-described current sensor cancels the induced voltage, can reduce the noise signal superimposed on the signal wiring, and can suppress a reduction in the detection accuracy.

According to a second aspect of the present embodiments, an electric current sensor for detecting a current flowing in a current path, includes: a current path; a magnetic detection unit having a magnetic detection element opposite to the current path and converting an alternating-current magnetic field, generated from the current path when an alternating current flows in the current path, to an electric signal, a signal line through which the electric signal flows, and a reference potential line that provides a reference potential; and a wiring substrate, on which the magnetic detection unit is mounted, including an insulation base, a signal wiring electrically connected to the signal line and disposed on the insulation base and a reference potential wiring electrically connected to the reference potential line and disposed on the insulation base. The reference potential wiring includes a flat plate portion arranged in parallel with the mounting surface of the insulation base. The flat plate portion is disposed opposite to the signal wiring so that the interlinkage magnetic flux generated by the alternating-current magnetic field is not applied to the signal wiring.

In the current sensor described above, the reference potential wiring having a flat plate shape is disposed opposite to the signal wiring. For this reason, the current sensor can suppress the alternating-current magnetic field from interlinking with the signal wiring. Therefore, the current sensor can reduce a noise signal superimposed on the signal wiring, and can suppress a reduction of the detection accuracy.

The current sensor 100 according to this embodiment will be described with reference to FIGS. 1, 2, and 3. The current sensor 100 detects a current flowing through the bus bar 40. In this embodiment, a magnetic balance type current sensor 100 is employed as an example. Moreover, the current sensor 100 may be, for example, a coreless current sensor that does not require a magnetic core. The circuit configuration of the current sensor 100 will be described later. In FIG. 1, the first magnetic shield 31 and the bus bar 40 are illustrated by dotted lines in order to show the positional relationship between the components of the current sensor 100, and the inner layer provided inside the base material 21 in the wiring board 20. The wiring 22b is illustrated by a solid line.

The current sensor 100 includes a sensor element 10, a wiring board 20, a first magnetic shield 31, a second magnetic shield 32, a bus bar 40, a housing 50, and the like. The current sensor 100 may be defined as a sensor layer in which the second magnetic shield 32, the bus bar 40, the sensor element 10, the wiring board 20, and the first magnetic shield 31 are stacked in this order. In the present embodiment, the current sensor 100 including the first magnetic shield 31, the second magnetic shield 32, and the housing 50 is employed. Alternatively, the present disclosure may not include the first magnetic shield 31, the second magnetic shield 32, and the housing 50. Moreover, the direction where each component is stacked is defined as a stacking direction.

The sensor element 10 corresponds to a magnetic detection unit. The sensor element 10 includes a mounting part 1 and a lead wiring 5 as a part of a lead frame, a signal processing part 2, a magnetic detection chip 3, a first wiring 4, a sealing resin 6, a second wiring 7 and the like.

The magnetic detection chip 3 includes a magnetic detection element 12 that is disposed to face a part of the bus bar 40 and converts an alternating-current magnetic field generated from the bus bar 40 into an electric signal when an alternating current flows through the bus bar 40. The magnetic detection element 12 has an electrode exposed on the surface thereof. Further, for example, a giant magnetoresistive element (GMR), an anisotropic magnetoresistive element (AMR), a tunnel magnetoresistive element (TMR), or a Hall element may be adopted as the magnetic detection element 12. In the present embodiment, the flat plate-shape magnetic detection chip 3 is employed. The magnetic detection chip 3 may have a rectangular parallelepiped shape.

The signal processing unit 2 is a processor that is electrically connected to the magnetic detection element 12 and adjusts the electric signal converted by the magnetic detection element 12 to be a predetermined voltage value. The signal processing unit 2 has electrodes exposed on the surface thereof. In this embodiment, the flat plate shape signal processing unit 2 is employed. The signal processing unit 2 may have a rectangular parallelepiped shape.

The signal processing unit 2 and the magnetic detection chip 3 are stacked and mounted in this order on the mounting unit 1. The signal processing unit 2 is mounted on the mounting unit 1 via, for example, an adhesive. Similarly, the magnetic detection chip 3 is mounted on the signal processing unit 2 via, for example, an adhesive. In the signal processing unit 2, its own electrode and the lead wiring 5 are electrically connected via the first wiring 4. On the other hand, in the magnetic detection chip 3, its own electrode and the electrode of the signal processing unit 2 are electrically connected via the second wiring 7. In FIG. 1, the second wiring 7 is not shown in order to prevent the drawing from becoming complicated.

The first wiring 4 includes a signal wiring 4a that is a part of a signal line through which an electric signal flows, and a ground wiring 4b that is a part of a reference potential line for providing a reference potential. The lead wiring 5 is a part of the lead frame separated from the mounting unit 1, and a plurality of lead wirings 5 are arranged around the mounting unit 1. The lead wiring 5 includes a signal lead 5a that is a part of a signal line through which an electric signal flows, and a ground lead 5b that is a part of a reference potential line for providing a reference potential.

Thus, the signal wiring 4a and the signal lead 5a are included in the signal line. The ground wiring 4b and the ground lead 5b are included in the reference potential line. In this embodiment, the ground potential is adopted as the reference potential.

The sealing resin portion 6 covers and seals the mounting unit 1, the signal processing unit 2, the magnetic detection chip 3, the first wiring 4, and the second wiring 7. The sealing resin part 6 may cover these with contacting them. Further, the sealing resin portion 6 covers other portions while exposing a part of the lead wiring 5 to the outside.

Here, the circuit configuration of the sensor element 10 will be described with reference to FIG. 3. In the present embodiment, the sensor element 10 includes the first resistor 11, the magnetic detection element 12, the operational amplifier 13, the feedback coil 14, the second resistor 15 and the like. In the sensor element 10, the first resistor 11 and the magnetic detection element 12 are connected in series between a power supply Vdd and the ground. The operational amplifier 13 corresponds to a supply unit. A voltage V2 between the first resistor 11 and the magnetic detection element 12 and a reference voltage V1 are applied to the operational amplifier 13. When the reference voltage V1 and the voltage V2 are applied, the operational amplifier 13 supplies the feedback coil 14 with a feedback current Ifb for forming a canceling magnetic field. The feedback current Ifb corresponds to a canceling current.

The feedback coil 14 corresponds to an electromagnet. The feedback coil 14 is connected in series with the second resistor 15 between the output terminal of the operational amplifier 13 and the ground. The feedback coil 14 is disposed to face the bus bar 40 and generates a canceling magnetic field for canceling the magnetic field to be detected by the magnetic detection element 12. That is, the feedback coil 14 generates a canceling magnetic field when the feedback current Ifb flows. The magnetic field detected by the magnetic detection element 12 is an inductive magnetic field generated from the bus bar 40 when a current flows through the bus bar 40.

The operational amplifier 13 controls the feedback current Ifb so that the canceling magnetic field generated from the feedback coil 14 and the inductive magnetic field generated from the bus bar 40 cancel each other, and the reference voltage V1 becomes equal to the voltage V2. The current sensor 100 detects a current flowing through bus bar 40 based on the feedback current Ifb. That is, the current sensor 100 can detect the current flowing through the bus bar 40 based on the output voltage Vout between the feedback coil 14 and the second resistor 15 in the sensor element 10. The second resistor 15 corresponds to a feedback resistor. In the present embodiment, the sensor element 10 including the signal processing unit 2 is employed. Alternatively, the sensor element 10 may not include the signal processing unit 2.

Figure 3:
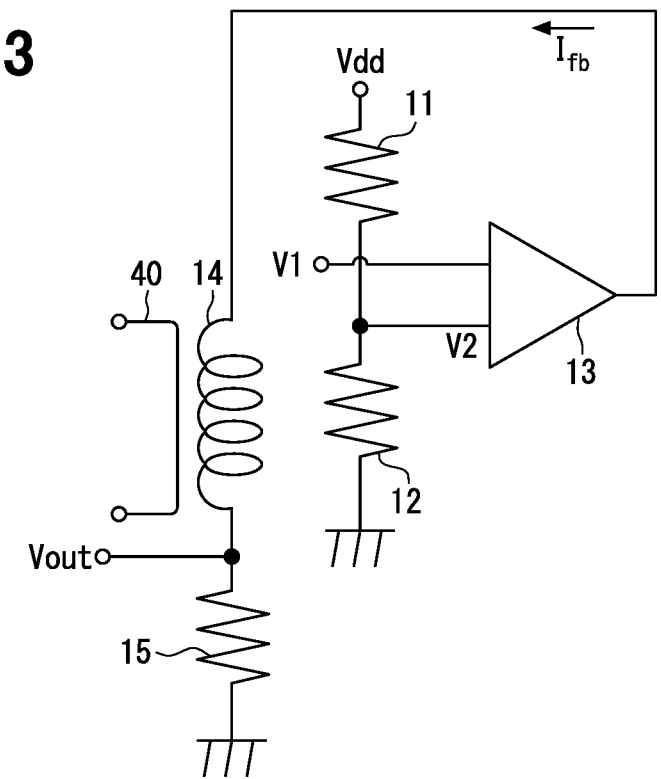
FIG. 3 is a circuit diagram showing a schematic configuration of the current sensor according to the first embodiment.
Figure 4:
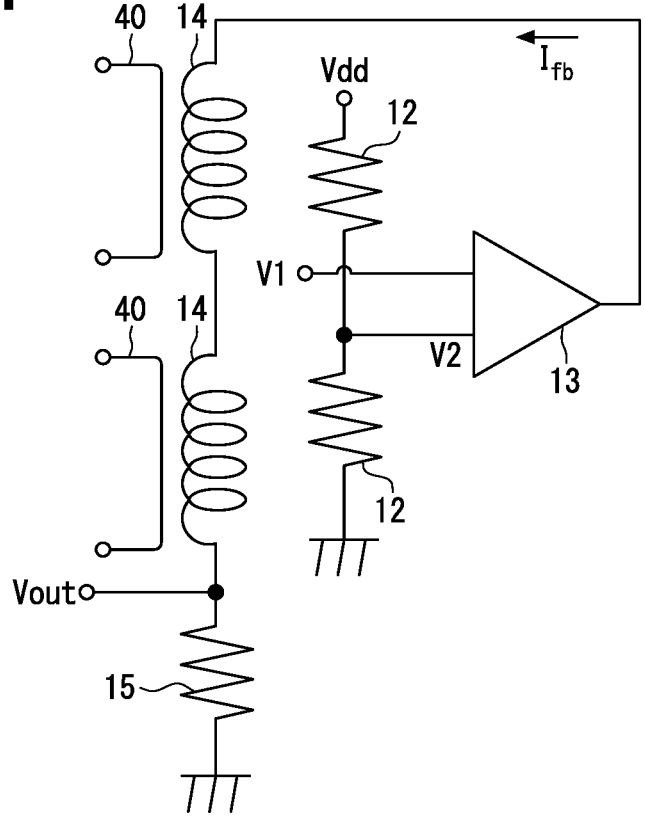
FIG. 4 is a circuit diagram showing a schematic configuration of a current sensor in a first modification.
Figure 5:
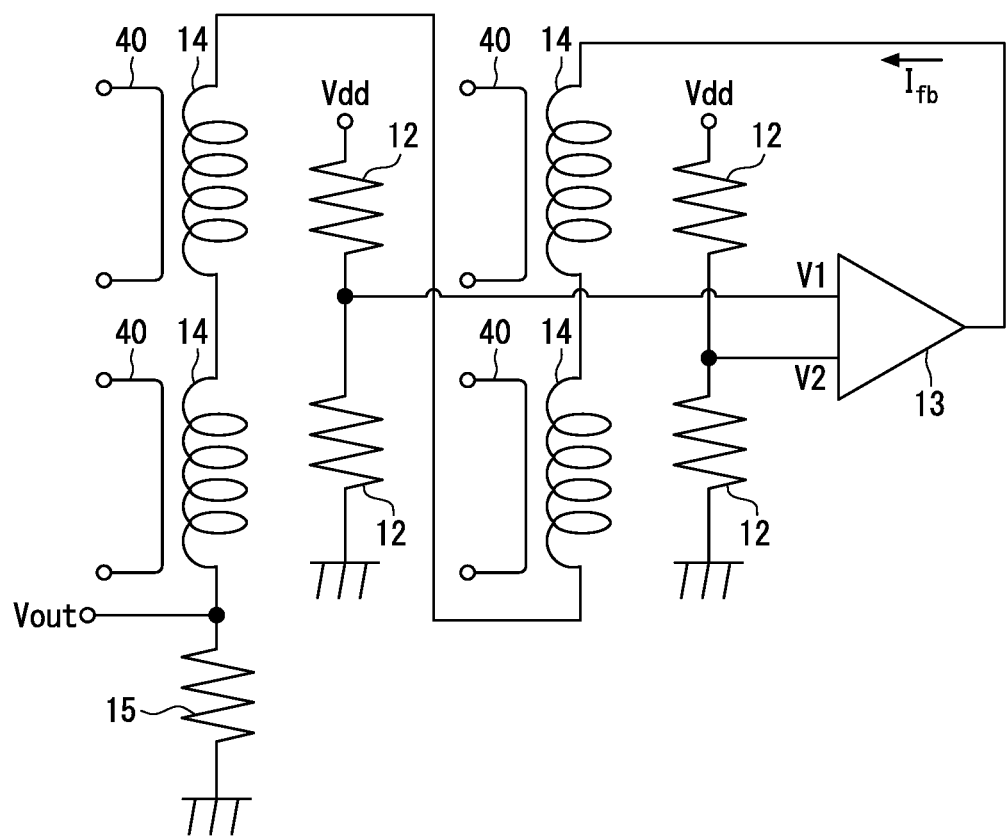
FIG. 5 is a circuit diagram showing a schematic configuration of a current sensor according to a second modification.

Alternatively, the circuit configuration of the sensor element 10 may not be limited to this feature. Even a circuit configuration such as the first modification shown in FIG. 4 or the second modification shown in FIG. 5 may be adopted. In FIGS. 4 and 5, the same components as those in FIG. 3 are denoted by the same reference numerals as in FIG. 3.

As shown in FIG. 4, the sensor element 10 in the first modification has a half-bridge configuration including upper and lower magnetic detection elements 12. That is, the sensor element 10 in the first modification has a circuit configuration in which two feedback coils 14 are connected in series and the magnetic detection elements 12 are connected in series. The voltage V2 between the two magnetic detection elements 12 and the reference voltage V1 are applied to the operational amplifier 13. Note that the two bus bars 40 in FIG. 4 are the same bus bar 40.

As shown in FIG. 5, the sensor element 10 in the second modification has a full-bridge configuration including upper and lower magnetic detection elements 12. That is, the sensor element 10 of the second modification has a circuit configuration in which four feedback coils 14 are connected in series and two sets of two magnetic detection elements 12 connected in series are included. A voltage V1 between one pair of the magnetic detection elements 12 connected in series and a voltage V2 between the other pair of the magnetic detection elements 12 connected in series are applied to the operational amplifier 13. Note that the four bus bars 40 in FIG. 5 are the same bus bar 40.

The sensor element 10 and the first magnetic shield 31 described later are disposed on the wiring board 20. More specifically, the wiring board 20 is prepared by forming a conductive wiring on an electrically insulating base material 21 such as resin or ceramics. The wiring board 20 has, for example, a rectangular parallelepiped shape. For example, a through hole as a part for fixing to the housing 50 is formed in the wiring board 20. The wiring board 20 is fixed to the housing 50 by inserting a fixing portion provided in the housing 50 into the through hole. Alternatively, the process structure of the wiring board 20 and the housing 50 may not be limited to this feature. The base material 21 corresponds to an insulating base material.

The wiring board 20 has the sensor element 10 formed on one surface thereof and the first magnetic shield 31 formed on the opposite surface thereof. That is, the sensor element 10 is formed on the surface of the wiring board 20 facing the housing 50 where the bus bar 40 is formed. The sensor element 10 and the first magnetic shield 31 are arranged so as to face each other via the wiring board 20 therebetween. Note that the surface of the wiring board 20 on which the sensor element 10 is mounted may be defined as a mounting surface.

The wiring board 20 includes, as parts of the wiring, an inner layer wiring 22b which is a signal wiring electrically connected to the signal line, and a surface layer wiring 22a which is a reference potential wiring electrically connected to the reference potential line. That is, the inner layer wiring 22b is electrically connected to the signal lead 5a through the conductive interlayer connection member formed on the base material 21. On the other hand, the surface layer wiring 22a is electrically connected to the ground lead 5b through a conductive connection member formed on the ground lead 5b. Furthermore, the wiring board 20 includes a power supply wiring as a part of the wiring. In FIG. 1, the inner layer wiring 22b is illustrated on the signal lead 5a in order to avoid the drawing from becoming complicated.

As will be described later, the current sensor 100 generates an AC magnetic field from the bus bar 40 when an AC current flows through the bus bar 40. In the wiring board 20, the inner layer wiring 22b is provided inside the base material 21, and the surface layer wiring 22a and the inner layer wiring 22b are arranged so as to intersect with each other, so that the region to which the interlinkage magnetic flux by this alternating-current magnetic field is applied is divided into two or more areas. That is, as shown in FIG. 1, in the wiring board 20, the surface layer wiring 22a and the inner layer wiring 22b intersect in a perspective view from a direction perpendicular to the mounting surface of the wiring board 20 (hereinafter simply referred to as a vertical direction). Here, the surface layer wiring 22a and the inner layer wiring 22b include a linear portion provided linearly and an inclined portion provided inclined with respect to the linear portion. The surface layer wiring 22a and the inner layer wiring 22b are provided so as to intersect at the inclined portions. The vertical direction indicates the same direction as the stacking direction.

In the following, a region sandwiched between the signal line and the reference potential line and a region sandwiched between both the wirings 22a and 22b are defined as a first region, which is disposed from the output portion of the signal processing unit 2 to the point at which both the wirings 22a and 22b intersect with each other. Further, a region sandwiched between both the wirings 22a and 22b and disposed from the point at which both wirings 22a and 22b intersect with each other is referred to as a second region. Here, the output portion of the signal processing unit 2 is a part where the signal processing unit 2 is connected to the signal wiring 4a and the ground wiring 4b.

Vout1 in FIG. 1 is an output voltage obtained by adjusting the electric signal converted by the magnetic detection element 12 to be a predetermined voltage by the signal processing unit 2. On the other hand, Vout2 in FIG. 1 is an output voltage after passing through the signal wiring 4a, the signal lead 5a, and the surface layer wiring 22a. The electric signal converted by the magnetic detection element 12 is transmitted to the signal processing unit 2 through the second wiring 7, adjusted to be a predetermined voltage by the signal processing unit 2, and transmitted to the external device through the signal wiring 4a, the signal lead 5a and the surface layer wiring 22a. The external device is a control system or an electronic control unit arranged outside the current sensor 100. The electric signal transmitted to the external device may be defined as a sensor signal.

As described above, the present disclosure employs the wiring substrate 20 in which the surface layer wiring 22a and the inner layer wiring 22b intersect each other. Alternatively, the present disclosure may not be limited to this example. In the wiring board 20, a part of the signal wiring and the reference potential wiring are arranged inside the base material 21, and the signal wiring and the reference potential wiring are arranged so as to intersect each other, so that the region, to which the interlinkage magnetic flux provided by the AC magnetic field is applied, is divided into two or more areas. For example, the wiring board 20 includes a portion where the signal wiring is arranged inside the base material 21 and a portion arranged on the surface of the base material 21. Alternatively, the wiring board 20 may include a portion where the reference potential wiring is arranged inside the base material 21 and a portion arranged on the surface of the base material 21.

The first magnetic shield 31 and the second magnetic shield 32 are made of a magnetic material. The first magnetic shield 31 and the second magnetic shield 32 suppress a disturbance magnetic field with respect to the sensor element 10, and form a pair arranged to face each other while sandwiching a part of the bus bar 40 and the sensor element 10. That is, the first magnetic shield 31 and the second magnetic shield 32 are arranged to face each other with a distance in the vertical direction, and are arranged so as to sandwich the sensor element 10 and the bus bar 40. Therefore, a part of the bus bar 40 and the sensor element 10 are arranged in the facing space between the first magnetic shield 31 and the second magnetic shield 32.

In the present embodiment, the first magnetic shield 31 and the second magnetic shield 32 having a thickness in the vertical direction and a rectangular shape in the XY plane are employed. Each magnetic shield 31 and 32 may be a plate-like member. Each of the magnetic shields 31 and 32 is configured, for example, by stacking plate-like magnetic materials. Further, as shown in FIG. 2, the magnetic shields 31 and 32 are large enough to cover the opposing area of the sensor element 10 and the opposing area of the bus bar 40.

Each of the magnetic shields 31 and 32 has a flat surface along the XY plane and is provided in parallel with the XY plane. In addition, since each magnetic shield 31 and 32 is arrange in parallel with each other, the shields 31 and 32 may be defined as parallel plate shields. Alternatively, the magnetic shields 31 and 32 may not be limited to the configuration described here. Naturally, the first magnetic shield 31 and the second magnetic shield 32 may not shield a magnetic field between the sensor element 10 and the bus bar 40 sandwiched between them. Therefore, the first magnetic shield 31 and the second magnetic shield 32 may not shield a magnetic field that is a detection target of the sensor element 10.

The bus bar 40 corresponds to a current path. The bus bar 40 generates an AC magnetic field from the bus bar 40 when an AC current flows through the bus bar 40. That is, the bus bar 40 generates an alternating-current magnetic field when an alternating current flows. The bus bar 40 connects, for example, an inverter and a motor. As shown in FIG. 1, for example, a plate-like conductive member may be used for the bus bar 40. The bus bar 40 includes a facing portion that faces the sensor element 10. This facing portion is a portion sandwiched between the first magnetic shield 31 and the second magnetic shield 32. The facing portion is a flat portion and is provided in parallel to a plane orthogonal to the vertical direction. The bus bar 40 is at least partially mounted in the housing 50.

Figure 2:
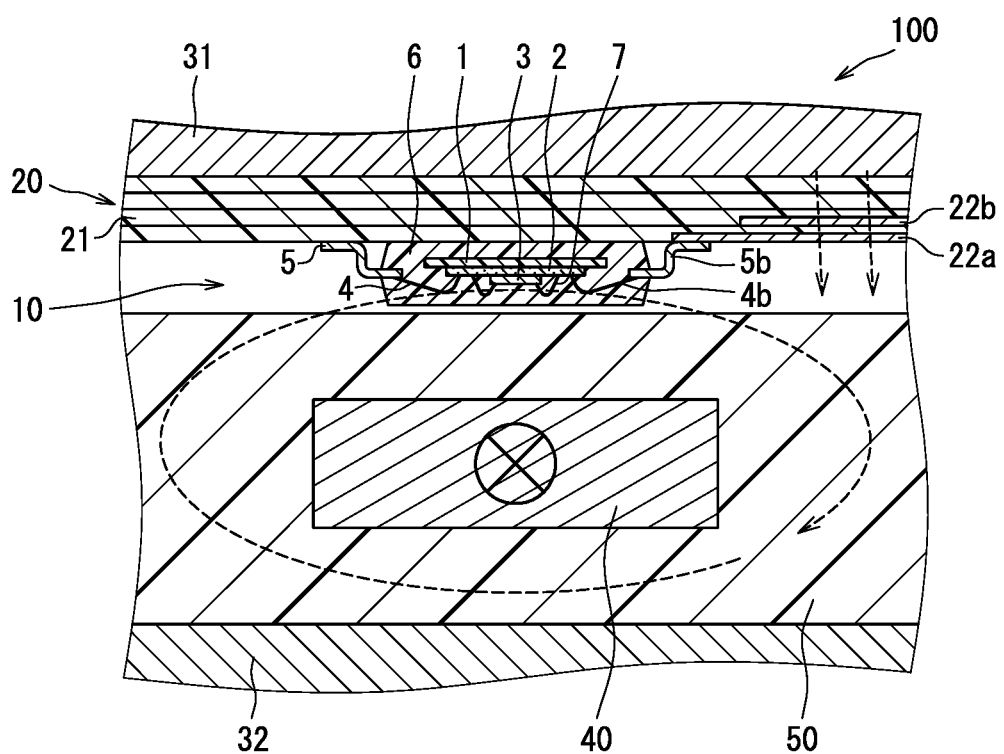
FIG. 2 is a cross section taken along line II-II in FIG. 1.

The housing 50 is made of, for example, resin or the like, and integrally holds the second magnetic shield 32 and the bus bar 40 as shown in FIG. 2. The housing 50 may be configured to integrally hold the second magnetic shield 32 and each bus bar 40 by an insert molding method or the like. As shown in FIG. 2, the second magnetic shield 32 is disposed so as to face the sensor element 10 through a part of the housing 50 and a part of the bus bar 40.

As described above, the present embodiment provides an example in which the sensor element 10, the first magnetic shield 31, the second magnetic shield 32, and the bus bar 40 are integrally configured by the wiring board 20 and the housing 50. Alternatively, the present disclosure may not be limited to this example.

Further, the output voltage of the current sensor 100 configured as described above will be described as follows.

The output voltage is defined as an equation of: $Vout2 = Vout1 - 2 \times (VN1 - VN2)$.

The first induction voltage is defined as an equation of: $VN1 = d\phi1/dt = S1 \cdot dB1/dt$.

The second induction voltage is defined as an equation of: $VN2 = d\phi2/dt = S2 \cdot dB2/dt$.

The first interlinkage magnetic flux IF1 is defined as an equation of $d\phi1/dt$.

The second interlinkage magnetic flux IF2 is defined as an equation of $d\phi2/dt$.

B1 is the magnetic flux density in the first region. B2 is the magnetic flux density in the second region. S1 is the interlinkage area of the first region. S2 is the interlinkage area of the second region.

In the current sensor 100, when an alternating-current magnetic field generated around the bus bar 40 is linked to the inner layer wiring 22b which is a signal wiring, an induced voltage proportional to the magnetic flux density and the linkage area is generated on the inner layer wiring 22b. For this reason, in the current sensor in which the signal wiring and the reference voltage wiring are provided in parallel, the induced voltage generated on the signal wiring is superimposed on the sensor signal as a noise signal.

In contrast, in the current sensor 100, the inner layer wiring 22b that is a signal wiring and the surface layer wiring 22a that is a reference potential wiring cross each other, and the region to which the interlinkage magnetic flux is applied is divided into two or more regions. Thus, in the current sensor 100, the inner layer wiring 22b, which is a signal wiring, is divided into two regions where a positive induced voltage and a negative induced voltage are generated when viewed from the ground. Therefore, in the current sensor 100, the induced voltages are cancelled with each other, so that the noise signal superimposed on the inner layer wiring 22b as the signal wiring is reduced, and a reduction in the detection accuracy is suppressed.

Second Embodiment

Here, the current sensor 110 according to the second embodiment will be described with reference to FIGS. 6, 7, and 8. Here, the points of the current sensor 110 different from the current sensor 100 will be mainly described. The current sensor 110 differs from current sensor 100 in that the sensor 110 has a plurality of sensor phases. That is, the current sensor 110 may include a plurality of current sensors 100. In FIG. 8, the wiring board 20 and the bus bar 40 are illustrated by dotted lines in order to avoid the drawing from becoming complicated. Further, in FIG. 8, in order to make it easy to understand the positional relationship between the wirings 22a to 22c, portions provided inside the base material 21 are also illustrated.

Note that, in the constituent elements of the current sensor 110, the same reference numerals as those of the current sensor 100 are given to portions of the sensor 110 that are the same as those of the current sensor 100. Therefore, the portion to which the same reference numeral as the current sensor 100 is assigned is applicable with reference to the above embodiment. Furthermore, the circuit configuration of the sensor element 10 in the current sensor 110 is the same as that of the current sensor 100. Therefore, the circuit configuration of the sensor element 10 may be applied with reference to the above embodiment.

Hereinafter, three directions perpendicular to each other are denoted as an X direction, a Y direction, and a Z direction. In addition, a plane defined by the X direction and the Y direction is denoted as an XY plane, a plane defined by the X direction and the Z direction is denoted as an XZ plane, and a plane defined by the Y direction and the Z direction is denoted as a YZ plane. The Z direction corresponds to the vertical direction.

The current sensor 110 may be applied to a system including a booster circuit, two inverters, and two motor generators (hereinafter referred to as motors) as described in, for example, JP-2016-178799-A. That is, the current sensor 110 is mounted on the vehicle together with a booster circuit having a reactor, two inverters that convert DC electric power boosted by the booster circuit into three-phase AC electric power, and tow motors that is operated by applying three-phase AC electric power from each inverter.

And the current sensor 110 has the structure which detects the current flowing between the inverter and the motor and the reactor current flowing through a reactor. More specifically, the current sensor 110 individually detects the current flowing through each of the six bus bars 40 that electrically connect the inverter and the motor, and also detects the reactor current flowing through the other bus bars 40.

The current sensor 110 includes a first sensor phase P1, a second sensor phase P2, and a third sensor phase P3 corresponding to one set of the inverter and motor, and a fourth sensor phase P4, a fifth sensor phase P5 and a sixth sensor phase P6 corresponding to another set of inverter and motor. Furthermore, the current sensor 110 includes a reactor current phase IL for detecting the reactor current. Note that the current sensor 110 may not include the reactor current phase IL.

The first sensor phase P1 to the third sensor phase P3 are provided corresponding to the V-phase, U-phase, and W-phase in the one set of inverter and motor, for detecting the current flowing in each phase between the inverter and motor. Similarly, the fourth sensor phase P4 to the sixth sensor phase P6 are provided corresponding to the V-phase, U-phase, and W-phase in another set of inverter and motor, for detecting the current flowing through each of the phases between the inverter and the motor. Thus, the current sensor 110 is a sensor that detects a current flowing through the bus bar 40 that is a current path.

In the system used in this embodiment, even if an error occurs in the current detection result in any one of the three sensor phases P1 to P3, when the current detection result in the other two phases has no error, the operation is hardly affected. Similarly, the same feature applies to the three sensor phases P4 to P6. Therefore, in the three sensor phases P1 to P3 and the three sensor phases P4 to P6, it is not necessary to redundantly arrange the two sensor elements 10 for one bus bar.

Thus, in the present embodiment, as an example, the current sensor 110 includes the reactor current phase IL in addition to the six sensor phases P1 to P6. Alternatively, the present disclosure may not be limited to this, and may include a plurality of sensor phases, that is, at least two sensor phases.

A configuration including a plurality of sensor phases, that is, at least two sensor phases may be applied to the above-described embodiments. That is, the current sensor 100 may be employed, for example, even when the sensor 10 has a configuration including the reactor current phase IL in addition to the six sensor phases P1 to P6, and may provide the same effects as described above.

Each of the sensor phases P1 to P6 and the reactor current phase IL have the same configuration as that of the current sensor 100. For this reason, the current sensor 110 includes eight sensor elements 10, eight first magnetic shields 31, and eight second magnetic shields 32. The current sensor 110 includes a wiring board 20 provided in common to the sensor phases P1 to P6 and the reactor current phase IL. The current sensor 110 is provided with one bus bar 40 for each of the sensor phases P1 to P6. Furthermore, the current sensor 110 provides, for example, one U-shaped bus bar 40 in the reactor current phase IL.

Figure 6:
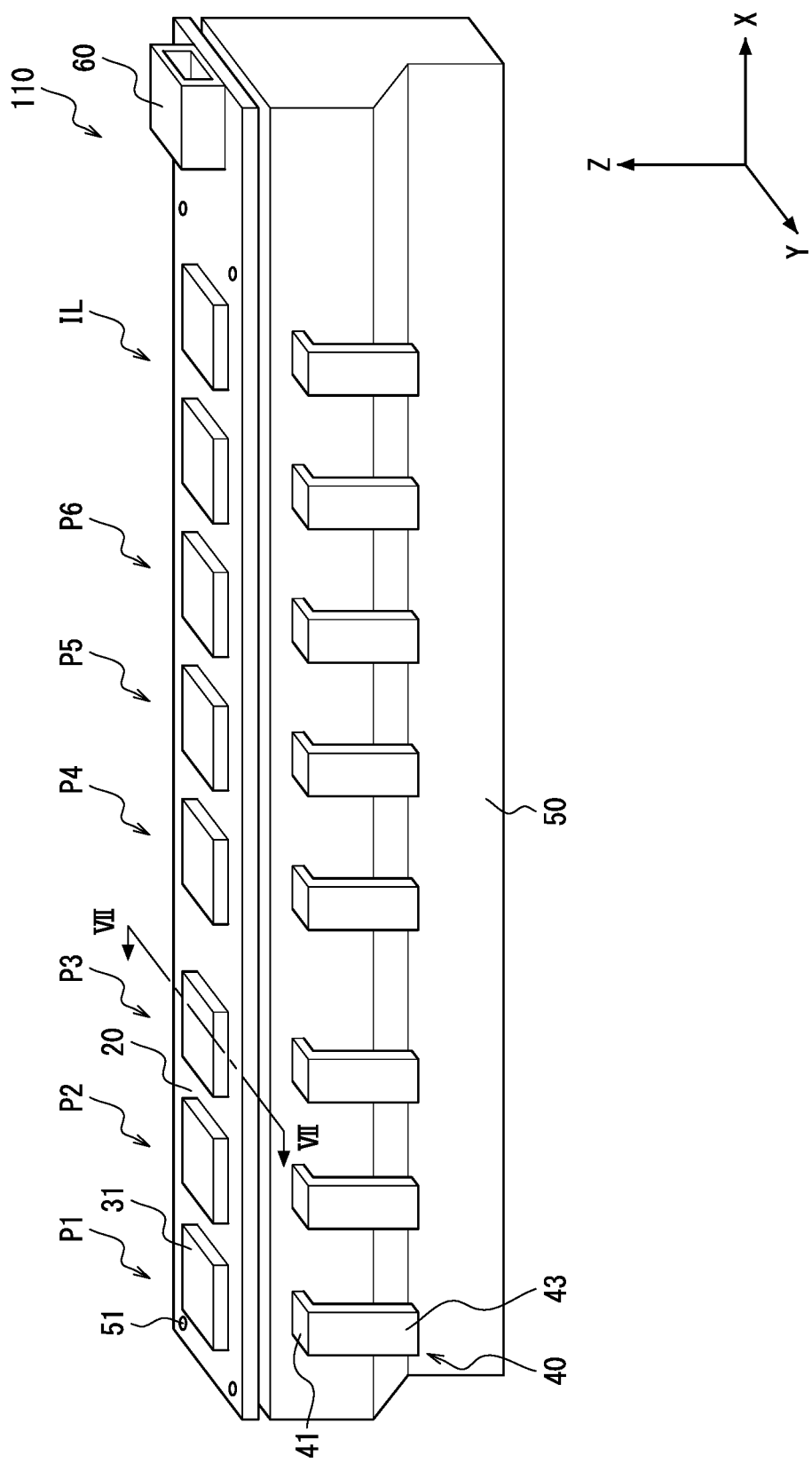
FIG. 6 is a perspective view showing a schematic configuration of the current sensor according to a second embodiment.

As shown in FIG. 6, the sensor phases P1 to P6 are arranged adjacent to each other in a direction orthogonal to the stacking direction. Here, an example is adopted in which the sensor phases P1 to P6 are arranged side by side in the X direction. In other words, the sensor phases P1 to P6 are arranged such that the directions of current flows (i.e., Y direction) are parallel in the facing portions 41 described later. The first magnetic shields 31 of the sensor phases P1 to P6 have the same position in the Z direction and the same position in the Y direction, but have different positions in the X direction. The same feature is applied to the sensor element 10, the second magnetic shield 32, and the bus bar 40. Regarding the bus bar 40, the positions in the Z direction and the positions in the Y direction in the bus bars 40 are the same, and the positions in the X direction in the bus bars 40 are different.

The sensor phases P1 to P6 have the same configuration. Therefore, in FIG. 7, the third sensor phase P3 is adopted as a representative example. The third sensor phase P3 includes the sensor element 10, the first magnetic shield 31, the second magnetic shield 32, and the bus bar 40. The sensor element 10 includes a magnetic detection element 12 that is disposed to face a part of the bus bar 40, detects the alternating-current magnetic field generated from the bus bar 40 when an alternating current flows through the bus bar 40, and converts the magnetic field into the electric signal.

The bus bar 40 connects the inverter and the motor. As shown in FIGS. 6 and 7, the bus bar 40 has, for example, a shape in which a plate-like conductive member is bent. In the bus bar 40, the facing portion 41, the first terminal portion 42, and the second terminal portion 43 are configured as a single body. For example, the first terminal portion 42 is provided with a first screw hole 44.

The facing portion 41 is a portion facing the sensor element 10 and is a portion sandwiched between the first magnetic shield 31 and the second magnetic shield 32. The facing portion 41 is a flat part and is provided in parallel to the XY plane. The facing portion 41 is at least partially mounted in the housing 50.

The facing portion 41 is provided with a first terminal portion 42 at one end thereof and a second terminal portion 43 at the other end thereof. For this reason, the facing portion 41 is a portion provided between the first terminal portion 42 and the second terminal portion 43.

The first terminal portion 42 is, for example, a motor side terminal. The first terminal portion 42 is a portion bent from the facing portion 41 to the second magnetic shield 32 side instead of the first magnetic shield 31 side. In the present embodiment, the first terminal portion 42 bent at a right angle with respect to the facing portion 41 is employed.

For this reason, the first terminal portion 42 includes a part which overlaps with the second magnetic shield 32 at the part facing one side surface of the second magnetic shield 32, i.e., in the direction orthogonal to the stacking direction. That is, the first terminal portion 42 does not include the part which overlaps with the sensor element 10 in the direction orthogonal to the stacking direction.

The first terminal portion 42 is provided with a first screw hole 44 penetrating in the thickness direction so as to be electrically and mechanically connected to the motor. For example, the first terminal portion 42 is embedded in the housing 50 with exposing the outer surface from the housing 50.

The housing 50 is provided with a second screw hole 52 at a position facing the first screw hole 44. The current sensor 110 is electrically and mechanically connected to the motor by inserting a screw into the first screw hole 44 and the second screw hole 52 and screwing it to the motor.

The second terminal portion 43 is, for example, a terminal on the inverter side. The second terminal portion 43 is a portion bent from the facing portion 41 to the second magnetic shield 32 side instead of the first magnetic shield 31 side. In the present embodiment, the second terminal portion 43 bent at a right angle with respect to the facing portion 41 is employed.

For this reason, the second terminal portion 43 includes a part which overlaps with the second magnetic shield 32 at the part facing one side surface of the second magnetic shield 32, i.e., in the direction orthogonal to the stacking direction. That is, the second terminal portion 43 does not include the part which overlaps with the sensor element 10 in the direction orthogonal to the stacking direction.

Thus, the bus bar 40 has the first terminal portion 42 and the second terminal portion 43 which are arranged in parallel to each other. That is, in the bus bar 40, the first terminal portion 42 and the second terminal portion 43 are parallel in the YZ plane.

Figure 7:
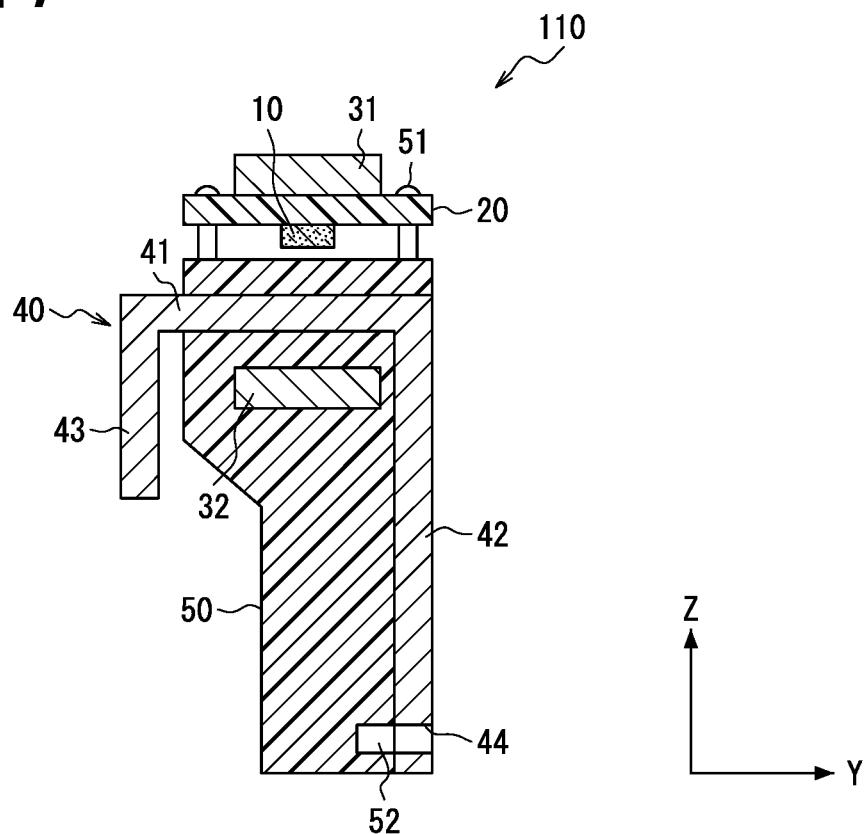
FIG. 7 is a cross section taken along line VII-VII in FIG. 6.

As shown in FIG. 7, the second terminal portion 43 is provided, for example, at an end of the facing portion 41 whose outer surface protrudes from the housing 50. For this reason, the second terminal portion 43 is not embedded in the housing 50.

As shown in FIG. 8, the wiring board 20 of the current sensor 110 is provided with a power supply wiring 22c in addition to an inner layer wiring 22b that is a signal wiring and a surface layer wiring 22a that is a reference potential wiring. In FIG. 8, the wirings 22a to 22c are illustrated using different line types for easy understanding. Specifically, the inner layer wiring 22b is illustrated by a solid line, and the power supply wiring 22c is illustrated by a dot chain line. Furthermore, the surface layer wiring 22a is enclosed by a two-dot chain line and hatched.

That is, the surface layer wiring 22a has a flat plate shape different from the above embodiment. The surface layer wiring 22a is a solid wiring. The surface layer wiring 22a is formed in parallel with the mounting surface of the base material 21, that is, the XY plane. And the surface layer wiring 22a has a flat part arranged facing the inner layer wiring 22b. That is, the inner layer wiring 22b is included in a region opposite to the surface layer wiring 22a. Note that the surface layer wiring 22a does not necessarily have a flat plate shape as a whole, as long as the wiring 22a includes a flat plate portion.

Thus, in the current sensor 110, the flat surface layer wiring 22a is disposed opposite to the inner layer wiring 22b. For this reason, in the current sensor 110, it is possible to suppress the alternating-current magnetic field from inter- linking with the inner layer wiring 22b. Therefore, in the current sensor 110, a noise signal superimposed on the inner layer wiring 22b can be reduced, and a decrease in the detection accuracy can be suppressed.

This feature may also be applied to a current sensor having a single sensor phase. That is, the same effect can be obtained even when the surface layer wiring 11a and the inner layer wiring 22b of the current sensor 110 are used instead of the surface layer wiring 11a and the inner layer wiring 22b in the current sensor 100.

Further, the wiring board 20 is provided with a connector 60 for electrically connecting the current sensor 110 and an external device. The connector 60 includes terminals that are electrically connected to the wirings 22a to 22c, a connector case that surrounds the terminals, and the like.

Furthermore, in this embodiment, as shown in FIG. 8, a wiring board 20 on which a second resistor 15 and a feedback wiring 16 are formed is employed. The feedback wiring 16 includes two wirings that are electrically connected to the second resistor 15. In the current sensor 110, the feedback wiring 16 is electrically connected to each of the two lead wires. In the current sensor 110, the feedback wiring 16 and the second resistor 15 are electrically connected.

The feedback wiring 16 is arranged so as to intersect with each other so that the induced voltage generated in the feedback wiring 16 is canceled by the interlinkage magnetic flux. That is, the feedback wiring 16 is arranged so that two wirings intersect with each other. The feedback wiring 16 may also be provided linearly without the two wirings intersecting each other. The current sensor 110 includes the feedback wiring 16 provided so that the two wirings intersect each other. For this reason, since the current sensor 110 can suppress the noise signal from being superimposed on the feedback wiring 16, it is possible to further suppress the decrease in detection accuracy.

This feature may also be applied to the first embodiment. That is, the feedback wiring 16 of the current sensor 100 may be provided on the wiring board 20 and may be arranged so as to intersect so that the induced voltage generated in the feedback wiring 16 is cancelled by the interlinkage magnetic flux. Thus, the current sensor 100 may have the same effect as the current sensor 110.

Although the present disclosure is described based on the above embodiment, the present disclosure is not limited to the embodiment and the structure. The present disclosure encompasses various modifications and variations within the scope of equivalents. In addition, various combinations and forms, and further, other combinations and forms including only one element, or more or less than these elements are also within the scope and the scope of the present disclosure.

What is claimed is:

1. A current sensor for detecting a current flowing in a current path, comprising:
   the current path;
   a magnetic detection unit having a magnetic detection element opposed to the current path and converting an alternating-current magnetic field generated from the current path into an electric signal when an alternating current flows through the current path, a signal line through which the electric signal flows, and a reference potential line providing a reference potential; and
   a wiring board, on which the magnetic detection unit is mounted, having an insulation base and a wiring including a signal wiring electrically connected to the signal line and arranged on the insulation base and a reference potential wiring electrically connected to the reference potential line, wherein:

a part of the signal wiring and a part of the reference potential wiring are arranged inside the insulation base; and the signal wiring and the reference potential wiring are arranged so as to intersect with each other, and a region, to which an interlinkage magnetic flux generated by the alternating-current magnetic field is applied, is divided into two or more areas.

2. The current sensor according to claim 1, further comprising:

an electromagnet for generating a cancelation magnetic field for canceling the alternating-current magnetic field to be detected by the magnetic detection element;

a supply unit for supplying a cancelation current for providing the cancelation magnetic field to the electromagnet; and a feedback resistor electrically connecting the electromagnet and a ground via a feedback wiring, wherein:

the feedback wiring is arranged on the wiring board; and the feedback wiring is arranged to intersect each other for cancelling an induced voltage generated in the feedback wiring by the interlinkage magnetic flux.

3. The current sensor according to claim 1, wherein:

the magnetic detection unit further includes a signal processor that adjusts the electric signal to be a predetermined voltage.

4. The current sensor according to claim 1, further comprising:

a first magnetic shield and a second magnetic shield configured to suppress a disturbance magnetic field with respect to the magnetic detection unit and to provide a pair opposed to each other while sandwiching a part of the current path and the magnetic detection unit.

5. The current sensor according to claim 4, further comprising:

a plurality of sensor phases, wherein:

each sensor phase is provided by stacking the second magnetic shield, the current path, the magnetic detection unit and the first magnetic shield in order; and the plurality of sensor phases are arranged adjacent to each other in a direction orthogonal to the stacking direction.

6. A current sensor for detecting a current flowing in a current path, comprising:

the current path;

a magnetic detection unit having a magnetic detection element opposed to the current path and converting an alternating-current magnetic field generated from the current path into an electric signal when an alternating current flows through the current path, a signal line through which the electric signal flows, and a reference potential line providing a reference potential; and a wiring board, on which the magnetic detection unit is mounted, having an insulation base and a wiring including a signal wiring electrically connected to the signal line and arranged on the insulation base and a reference potential wiring electrically connected to the reference potential line, wherein:

the reference potential wiring includes a flat plate portion arranged in parallel with a mounting surface of the insulation base; and the flat plate portion is opposed to the signal wiring so as not to apply an interlinkage magnetic flux generated by the alternating-current magnetic field to the signal wiring, further comprising:

an electromagnet for generating a cancelation magnetic field for canceling the alternating-current magnetic field to be detected by the magnetic detection element;

a supply unit for supplying a cancelation current for providing the cancelation magnetic field to the electromagnet; and a feedback resistor electrically connecting the electromagnet and a ground via a feedback wiring, wherein:

the feedback wiring is arranged on the wiring board; and the feedback wiring is arranged to intersect each other for cancelling an induced voltage generated in the feedback wiring by the interlinkage magnetic flux.

7. A current sensor for detecting a current flowing in a current path, comprising:

the current path;

a magnetic detection unit having a magnetic detection element opposed to the current path and converting an alternating-current magnetic field generated from the current path into an electric signal when an alternating current flows through the current path, a signal line through which the electric signal flows, and a reference potential line providing a reference potential; and a wiring board, on which the magnetic detection unit is mounted, having an insulation base and a wiring including a signal wiring electrically connected to the signal line and arranged on the insulation base and a reference potential wiring electrically connected to the reference potential line, wherein:

the reference potential wiring includes a flat plate portion arranged in parallel with a mounting surface of the insulation base; and the flat plate portion is opposed to the signal wiring so as not to apply an interlinkage magnetic flux generated by the alternating-current magnetic field to the signal wiring, wherein:

the magnetic detection unit further includes a signal processor that adjusts the electric signal to be a predetermined voltage.

8. A current sensor for detecting a current flowing in a current path, comprising:

the current path;

a magnetic detection unit having a magnetic detection element opposed to the current path and converting an alternating-current magnetic field generated from the current path into an electric signal when an alternating current flows through the current path, a signal line through which the electric signal flows, and a reference potential line providing a reference potential; and a wiring board, on which the magnetic detection unit is mounted, having an insulation base and a wiring including a signal wiring electrically connected to the signal line and arranged on the insulation base and a reference potential wiring electrically connected to the reference potential line, wherein:

the reference potential wiring includes a flat plate portion arranged in parallel with a mounting surface of the insulation base;

the flat plate portion is opposed to the signal wiring so as not to apply an interlinkage magnetic flux generated by the alternating-current magnetic field to the signal wiring, and a first magnetic shield and a second magnetic shield configured to suppress a disturbance magnetic field with respect to the magnetic detection unit and to provide a pair opposed to each other while sandwiching a part of the current path and the magnetic detection unit.

9. The current sensor according to claim 8, further comprising:
a plurality of sensor phases, wherein:
each sensor phase is provided by stacking the second magnetic shield, the current path, the magnetic detection unit and the first magnetic shield in order; and
the plurality of sensor phases are arranged adjacent to each other in a direction orthogonal to the stacking direction.

* * * * *